(12) United States Patent
Hudson et al.

(10) Patent No.: US 9,423,718 B2
(45) Date of Patent: Aug. 23, 2016

(54) LASER SCAN UNIT HOUSING FOR AN IMAGE FORMING DEVICE

(71) Applicant: Lexmark International, Inc., Lexington, KY (US)

(72) Inventors: Randall Lee Hudson, Lexington, KY (US); Jason Lee Rowe, Richmond, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 14/587,808

(22) Filed: Dec. 31, 2014

(65) Prior Publication Data

US 2016/0187804 A1 Jun. 30, 2016

(51) Int. Cl.
| | |
|---|---|
| *G03G 15/00* | (2006.01) |
| *G03G 15/04* | (2006.01) |
| *G02B 26/12* | (2006.01) |
| *H05K 9/00* | (2006.01) |
| *G03G 15/043* | (2006.01) |

(52) U.S. Cl.
CPC ........ *G03G 15/04036* (2013.01); *G02B 26/121* (2013.01); *G02B 26/123* (2013.01); *H05K 9/0007* (2013.01); *H05K 9/0049* (2013.01); *G03G 15/043* (2013.01)

(58) Field of Classification Search
CPC .......... G03G 15/043; G03G 15/04036; H05K 9/0007; H05K 9/0049
See application file for complete search history.

(56) References Cited

U.S. PATENT DOCUMENTS

| | | | |
|---|---|---|---|
| 8,780,158 B2 | 7/2014 | Hudson et al. | |
| 2007/0013989 A1* | 1/2007 | Lim | G02B 26/12 359/216.1 |
| 2011/0235142 A1* | 9/2011 | Kusuda | B41J 2/471 359/197.1 |
| 2013/0070041 A1 | 3/2013 | Hudson et al. | |

OTHER PUBLICATIONS

Wikipedia Contributors, "Faraday cage," Wikipedia, The Free Encyclopedia, Dec. 29, 2013, Available at: https://en.wikipedia.org/w/index.php?title=Faraday_cage&oldid=588196968 (Retrieved Feb. 22, 2016).

* cited by examiner

*Primary Examiner* — David Gray
*Assistant Examiner* — Andrew V Do

(57) ABSTRACT

A scan unit for an imaging device having a movable mirror and one or more light sources. A light beam generated by each light source is directed towards the movable mirror, movement of the mirror causing each light beam that is reflected by the mirror to follow a distinct scan pattern. An optical assembly is associated with each reflected light beam to form an optical path for each reflected light beam from the mirror. A housing in which the movable mirror, the one or more light sources and the optical assembly are secured has at least a portion made from electrically conductive material for shielding an interior of the housing from electromagnetic fields external to the housing. A light drive circuitry card is disposed in the interior of the housing and communicatively coupled to the one or more light sources for driving the one or more light sources.

20 Claims, 6 Drawing Sheets

LASER SCAN UNIT HOUSING FOR AN IMAGE FORMING DEVICE

CROSS REFERENCES TO RELATED APPLICATIONS

The present application is related to U.S. patent application Ser. No. 13/250,157, filed Sep. 30, 2011, and entitled, "Laser scan unit housing for an imaging device," the content of which is incorporated by reference herein in its entirety.

STATEMENT REGARDING FEDERALLY SPONSORED RESEARCH OR DEVELOPMENT

None.

REFERENCE TO SEQUENTIAL LISTING, ETC.

None.

BACKGROUND

1. Field of the Disclosure

The present disclosure relates generally to a laser scan unit (LSU) of an electrophotographic imaging device, and particularly to a housing for the LSU of the electrophotographic imaging device.

2. Description of the Related Art

In laser imaging devices, toner is transferred to sheets of media using electrophotographic techniques involving a photoconductive drum as well as an LSU which scans an image on the photoconductive drum in order for toner to temporarily adhere for subsequent transfer to a sheet of media. The electrophotographic techniques typically produce unwanted electromagnetic interference (EMI). The risk of EMC-related problems affects internal components of the laser imaging device, particularly the LSU. Toroids, which have been used to at least partly reduce EMI problems, are expensive and thus in many instances cost prohibitive.

SUMMARY

Example embodiments of the present disclosure overcome shortcomings of prior laser scan units and thereby satisfy a need for an LSU for an imaging device having improved EMI protection. According to an example embodiment, the LSU includes a movable mirror, one or more light sources and an optical assembly. A light beam generated by each light source is directed towards the movable mirror such that movement of the mirror causes each light beam that is reflected by the mirror to follow a distinct scan pattern. The optical assembly forms an optical path for each light beam reflected by the mirror. The LSU also includes a housing in which the movable mirror, the one or more light sources and the optical assembly are secured. At least a portion of the housing is made from electrically conductive material for shielding an interior of the housing from electromagnetic fields external thereto. The LSU also includes a light drive circuitry card which provides video drive signals for driving the one or more light sources. In the example embodiment, the light drive circuitry card is disposed in the interior of the housing and communicatively coupled to the one or more light sources therein.

The housing may include a metal housing. The metal housing may be constructed from dead soft steel. The housing may be constructed from one of a metal and a metal-coated plastic. The housing may include a metallic mesh disposed about the interior or exterior of the housing. The housing thus forms a Faraday shield so as to at least lessen EMI effects on the LSU components contained within the housing.

BRIEF DESCRIPTION OF THE DRAWINGS

The above-mentioned and other features and advantages of the disclosed embodiments, and the manner of attaining them, will become more apparent and will be better understood by reference to the following description of the disclosed embodiments in conjunction with the accompanying drawings, wherein.

DETAILED DESCRIPTION

Figure 1:
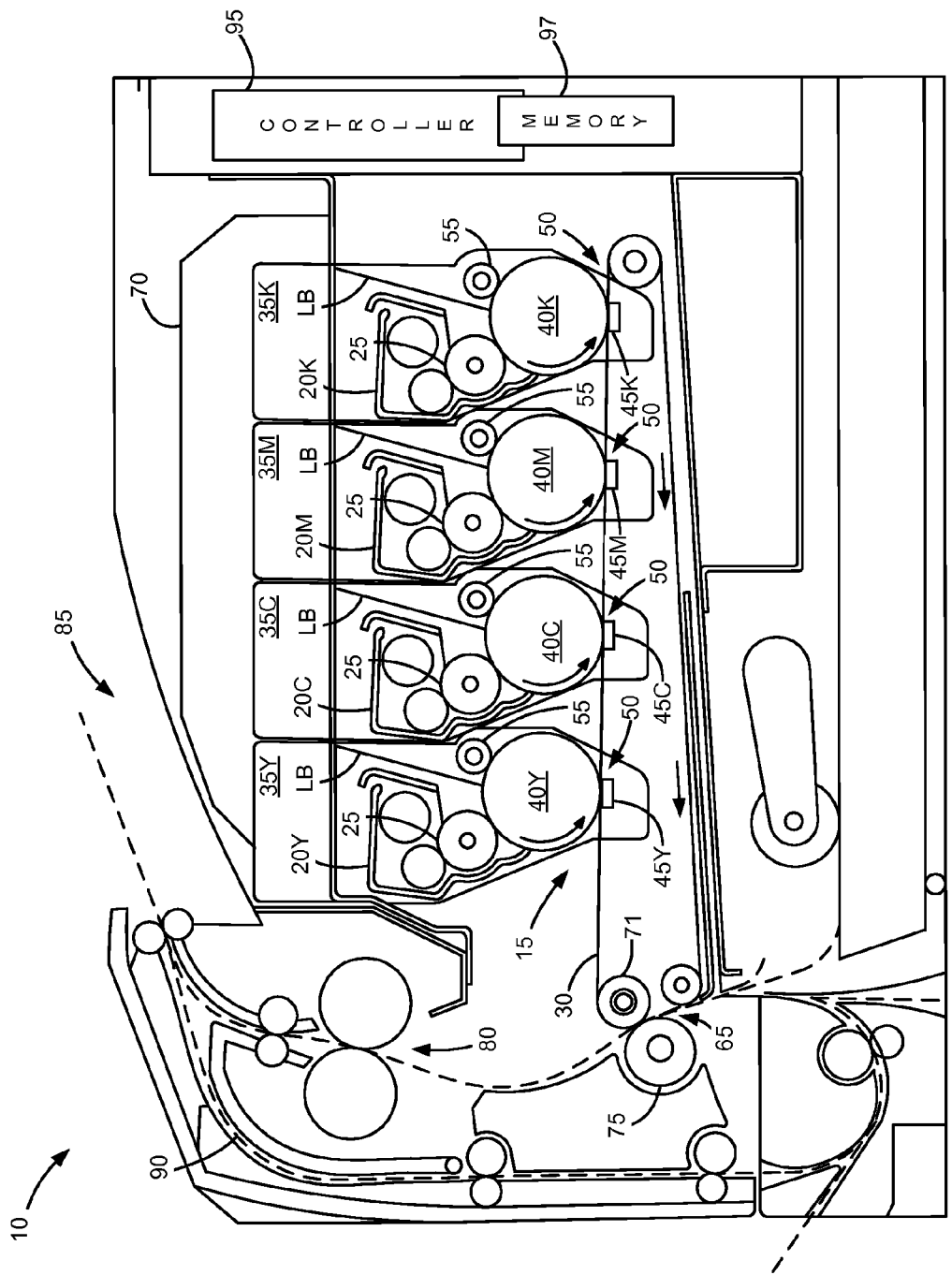
FIG. 1 is a side schematic view of an image forming device according to one example embodiment.

It is to be understood that the present disclosure is not limited in its application to the details of construction and the arrangement of components set forth in the following description or illustrated in the drawings. The present disclosure is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings. In addition, the terms "connected" and "coupled" and variations thereof are not restricted to physical or mechanical connections or couplings.

Spatially relative terms such as "top," "bottom," "front," "back" and "side," "above," "under," "below," "lower," "over," "upper," and the like, are used for ease of description to explain the positioning of one element relative to a second element. Terms such as "first," "second," and the like, are used to describe various elements, regions, sections, etc. and are not intended to be limiting. Further, the terms "a" and "an" herein do not denote a limitation of quantity, but rather denote the presence of at least one of the referenced item.

Furthermore, and as described in subsequent paragraphs, the specific configurations illustrated in the drawings are intended to exemplify embodiments of the disclosure and that other alternative configurations are possible.

Reference will now be made in detail to the example embodiments, as illustrated in the accompanying drawings. Whenever possible, the same reference numerals will be used throughout the drawings to refer to the same or like parts.

FIG. 1 illustrates an image forming device 10 according to an example embodiment. Image forming device 10 includes a first toner transfer area 15 having four developer units 20, including developer rolls 25, that substantially extend from one end of image forming device 10 to an opposed end thereof. Developer units 20 are disposed along an intermediate transfer member (ITM) 30. Each developer unit 20 holds a different color toner. The developer units 20 may be aligned in order relative to the direction of the ITM 30 indicated by the arrows in FIG. 1, with the yellow developer unit 20Y being the most upstream, followed by cyan developer unit 20C, magenta developer unit 20M, and black developer unit 20K being the most downstream along ITM 30.

Each developer unit 20 is operably connected to a toner reservoir 35 (i.e., toner reservoirs 35Y, 35C, 35M, 35K) for receiving toner for use in a printing operation. Each toner reservoir 35 is controlled to supply toner as needed to its corresponding developer unit 20. Each developer unit 20 is associated with a photoconductive member 40 (i.e., photoconductive memebers 40Y, 40C, 40M, 40K) that receives toner therefrom during toner development to form a toned image thereon. Each photoconductive member 40 is paired with a transfer member 45 (i.e., transfer memebers 45Y, 45C, 45M, 45K) to define a transfer nip 50 for use in transferring toner to ITM 30 at first transfer area 15.

Image forming device 10 further includes LSU 70. During color image formation, the surface of each photoconductive member 40 is charged to a specified voltage by a charge roller 55. At least one laser beam LB from LSU 70 is directed to the surface of each photoconductive member 40 and discharges those areas it contacts to form a latent image thereon. In one embodiment, areas on the photoconductive member 40 illuminated by the laser beam LB are discharged. The developer unit 20 then transfers toner to photoconductive member 40 to form a toner image thereon. The toner is attracted to the areas of the surface of photoconductive member 40 that are discharged by the laser beam LB from LSU 70.

ITM 30 is disposed adjacent to each of developer unit 20. In this embodiment, ITM 30 is formed as an endless belt disposed about a drive roller and other rollers. During image forming operations, ITM 30 moves past photoconductive members 40 in a clockwise direction as viewed in FIG. 1. One or more of photoconductive members 40 applies its toner image in its respective color to ITM 30. For mono-color images, a toner image is applied from a single photoconductive member 40K. For multi-color images, toner images are applied from two or more photoconductive members 40. In one embodiment, a positive voltage field formed in part by transfer member 45 attracts the toner image from the associated photoconductive member 40 to the surface of moving ITM 30.

ITM 30 rotates and collects the one or more toner images from the one or more photoconductive members 40 and then conveys the one or more toner images to a media sheet at a second transfer area 65. Second transfer area 65 includes a second transfer nip formed between a back-up roller 71 and a second transfer member 75.

A fuser assembly 80 is disposed downstream of second transfer area 65 and receives media sheets with the unfused toner images superposed thereon. In general terms, fuser assembly 80 applies heat and pressure to the media sheets in order to fuse toner thereto. After leaving fuser assembly 80, a media sheet is either deposited into an output media area 85 or enters duplex media path 90 for transport to second transfer area 65 for imaging on a second surface of the media sheet.

Image forming device 10 is depicted in FIG. 1 as a color laser printer in which toner is transferred to a media sheet in a two step operation. Alternatively, image forming device 10 may be a color laser printer in which toner is transferred to a media sheet in a single step process—from photoconductive members 40 directly to a media sheet. In another alternative embodiment, image forming device 10 may be a monochrome laser printer which utilizes only a single developer unit 20 and photoconductive member 40 for depositing black toner directly to media sheets. Further, image forming device 10 may be part of a multi-function product having, among other things, an image scanner for scanning printed sheets.

Still further, image forming device 10 may utilize other processes and/or architectures for transferring toner to media sheets, such as a dual component based architecture.

Image forming device 10 further includes a controller 95 and an associated memory 97. Though not shown in FIG. 1, controller 95 may be coupled to components and modules in image forming device 10 for controlling same. For instance, controller 95 may be coupled to toner reservoirs 35, developer units 20, photoconductive members 40, fuser assembly 80 and/or LSU 70 as well as to associated motors (not shown) for imparting motion thereto. It is understood that controller 95 may be implemented as any number of controllers and/or processors for suitably controlling image forming device 10 to perform, among other functions, printing operations.

Figure 2:
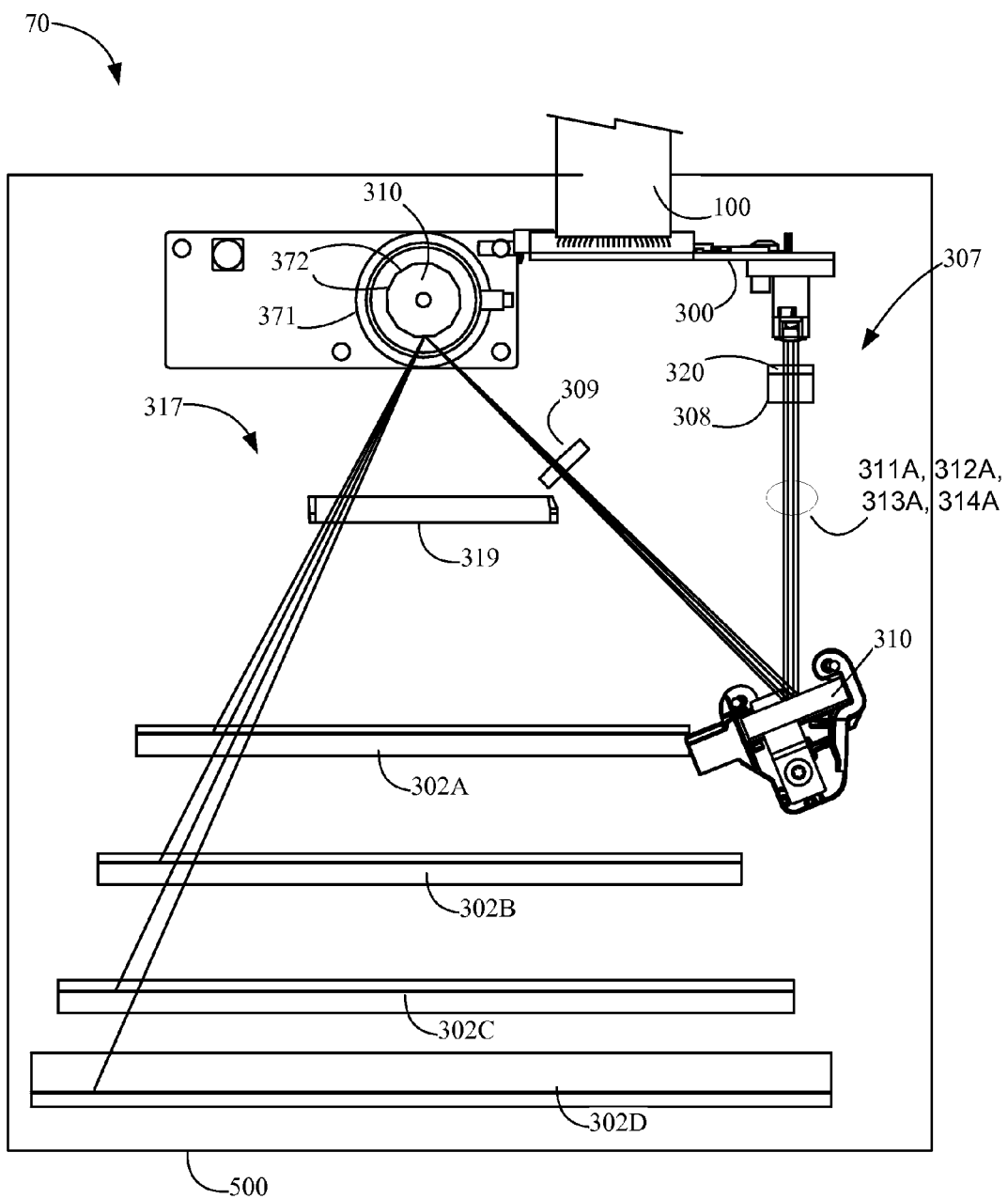
FIG. 2 is a simplified plan view of a laser scan unit (LSU) of the image forming device of FIG. 1.
Figure 3:
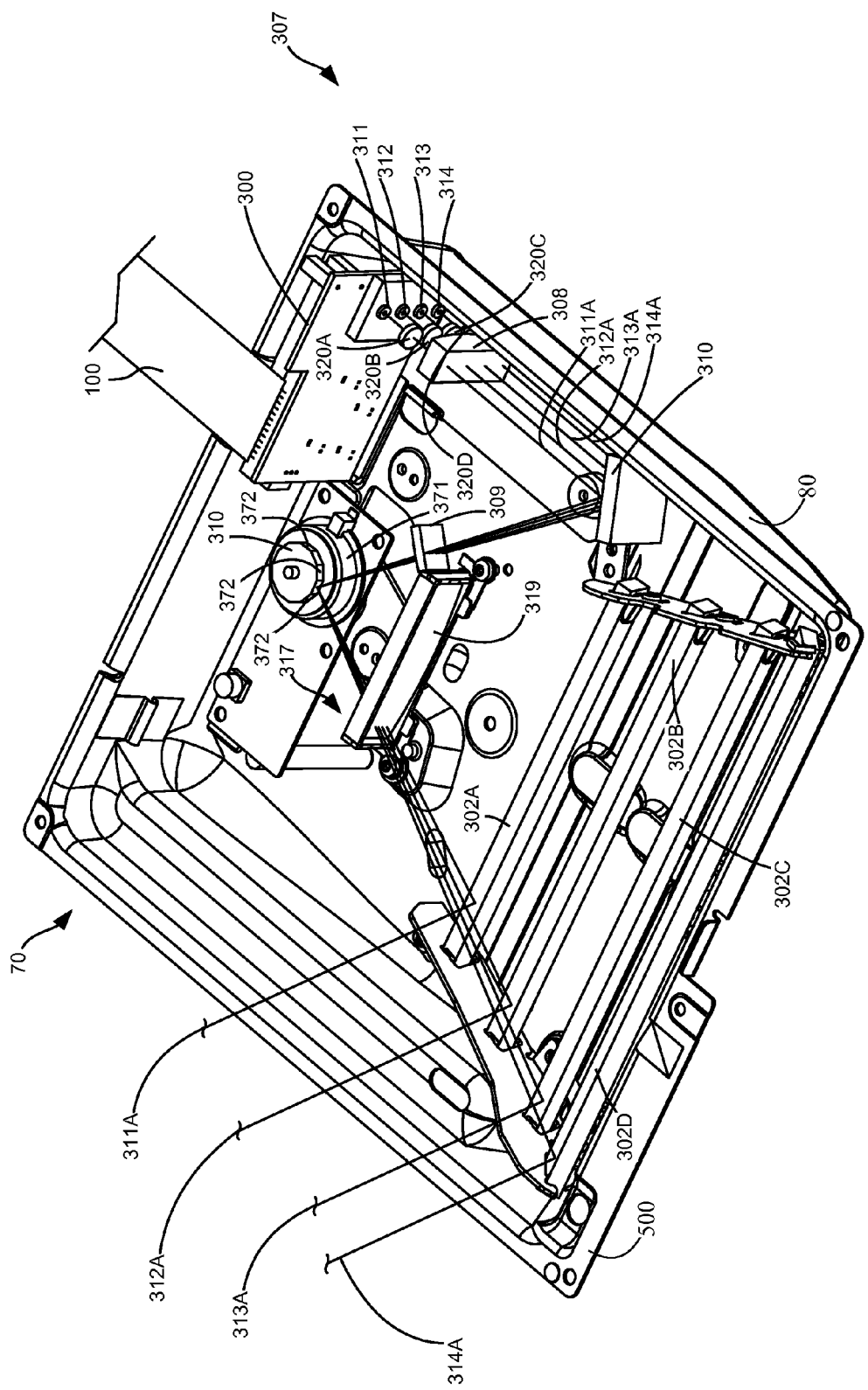
FIG. 3 is an interior perspective view of the LSU of FIG. 2.
Figure 4:
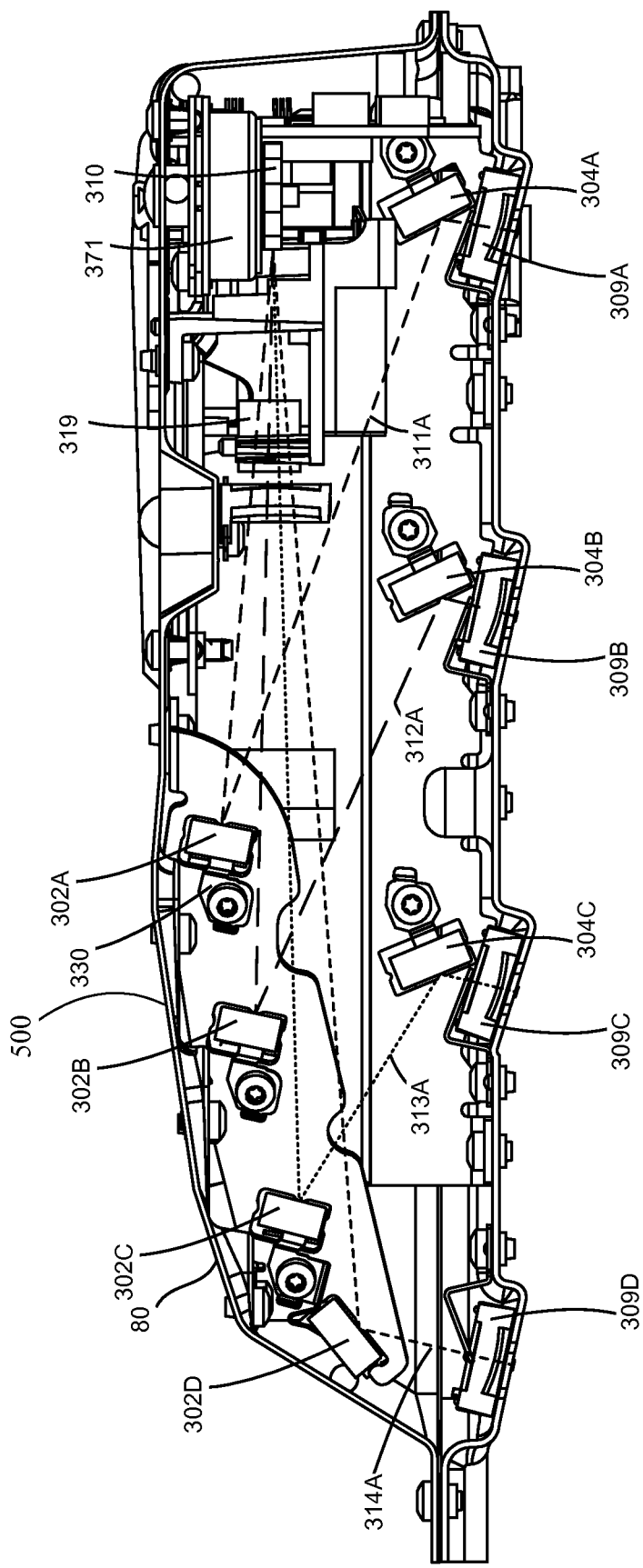
FIG. 4 is a side cross sectional view of the LSU of FIG. 3.

With reference now to FIGS. 2-4, LSU 70 includes a single rotatable polygonal mirror 310 that is powered by a motor 371, and a pre-scan optical assembly 307. Polygonal mirror 310 is supported for rotation about a rotational axis and includes a plurality of facets 372. It is understood that mirrors other than a rotatable, polygonal mirror may be utilized in LSU 70. In an alternative embodiment, LSU 70 may include an oscillating mirror, such as a galvanometric mirror (not shown), instead of polygonal mirror 310.

Pre-scan optical assembly 307 includes first laser diode 311 generating laser beam 311A, second laser diode 312 generating laser beam 312A, third laser diode 313 generating laser beam 313A, and fourth laser diode 314 generating laser beam 314A. It is understood that other light sources may be employed instead of laser diodes. Pre-scan optical assembly 307 also includes one or more lenses, such as collimation lenses 320A-320D associated with each laser diode 311-314, respectively, and first and second pre-scan lens assemblies 308 and 309.

Pre-scan optical assembly 307 further includes drive circuitry card 300 (FIGS. 2 and 3) onto which laser diodes 311-314 are mounted. Laser diode driver components (not shown) are also mounted onto drive circuitry card 300 which provide the necessary drive for powering laser diodes 311-314. Each of laser beams 311A, 312A, 313A and 314A is modulated by a video signal from controller 95 (via cable 100) so as to write pixels or pels as the beam scans along a corresponding scan path. For example, laser beam 311A is modulated according to a video signal corresponding to the cyan image plane.

Generally, each laser beam 311A, 312A, 313A, and 314A is reflected off the rotating polygonal mirror 310 and is then directed towards a corresponding one of the photoconductive drums 40 by select mirrors and lenses in a post-scan optical assembly 317, as shown in FIGS. 2-4. In particular, beam 311A, after being reflected off the rotating polygonal mirror 310, passes through collimation lens 319, is reflected by fixed mirrors 302A and 304A before passing through focus lens 309A and exiting LSU 70. Second beam 312A, after reflecting from rotating polygonal mirror 310 and passing through lens 319, is reflected by reflection mirrors 302B and 304B and passes through focus lens 309B before exiting LSU 70. Third beam 313A, after being reflected by rotating polygonal mirror 310 and passing through lens 319, is reflected by mirrors 302C and 304C and then passes through focus lens 309C before exiting LSU 70. Fourth beams 314A, after reflecting from rotating polygonal mirror 310 and passing through lens 319, is reflected by reflection mirror 302D and then passes through focus lens 309D before exiting LSU 70. After leaving LSU 70, each beam 311A-314A strikes a corresponding photoconductive drum 40 to create the latent image thereon. In particular, the rotation of polygonal mirror 310 and positioning of mirrors 302 and 304 of post-scan optical assembly 317 causes each laser beam 311A-314A to repeatedly sweep across its corresponding photoconductive drum 40 so as to form a latent image on the drum. It is understood that pre-scan assembly 307 and post-scan assembly 317 may use a different number and arrangement of mirrors and lens in creating scan patterns on photoconductive drums 40.

Figure 5:
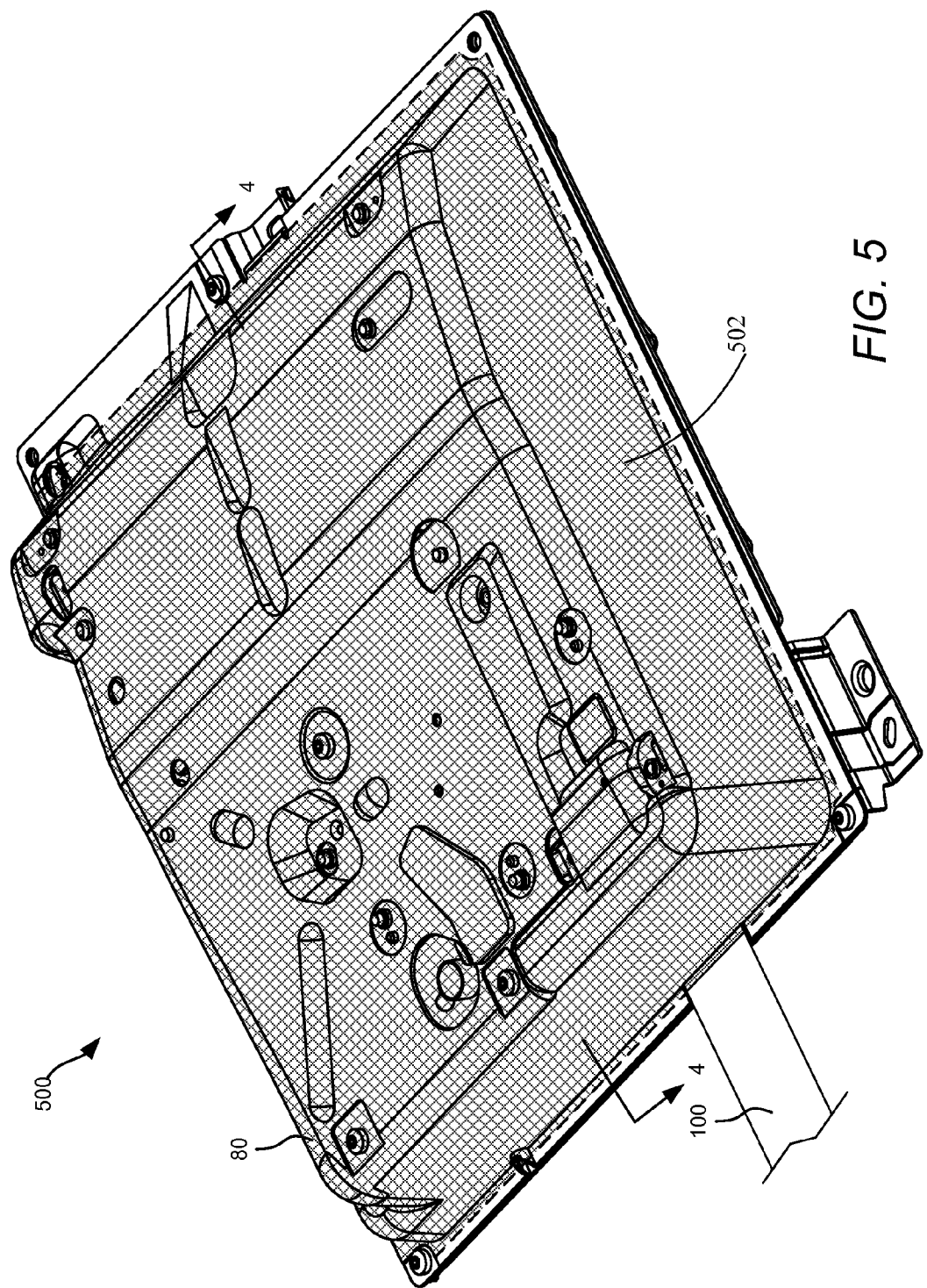
FIGS. 5 and 6 are exterior perspective views of the LSU housing of FIGS. 2 and 3.
Figure 6:
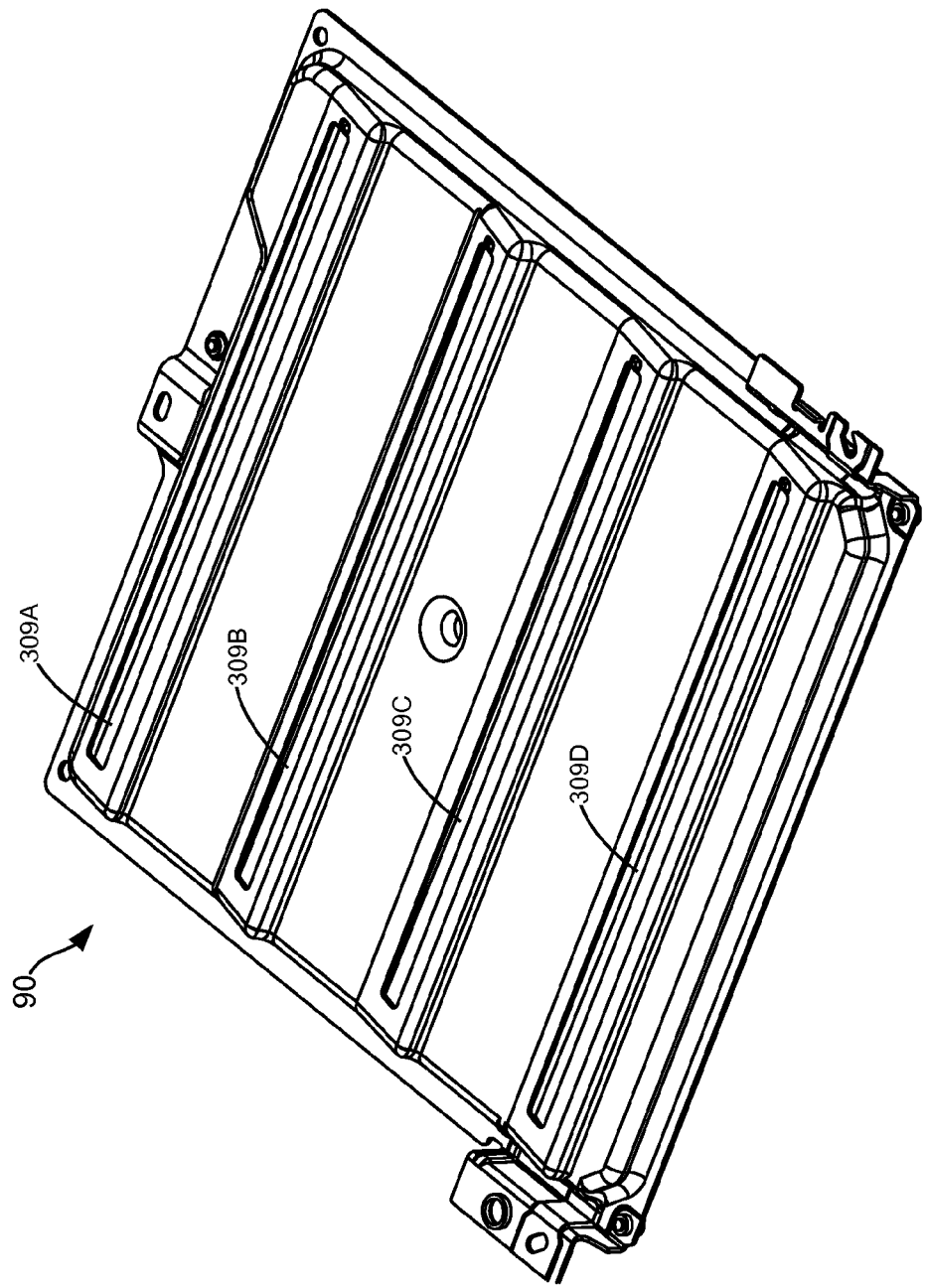

LSU 70 includes LSU housing 500 in which pre-scan assembly 307 and post-scan assembly 317 are disposed. With reference to FIGS. 3-5, LSU housing 500 includes a first portion 80 that is substantially bowl-shaped, having a concave inner surface to which components of assembly 307 and most of assembly 317 are connected. LSU housing 500 further includes a second portion 90 (FIG. 6) which serves as a cover or lid and to which lenses 309 are mounted. First portion 80 and second portion 90 define a substantially fully contained interior in which pre-scan assembly 307 and post-scan assembly 317 are disposed. In one example embodiment, LSU housing 500 is a metal housing and is constructed from dead soft steel. Alternatively, LSU housing 500 may be constructed from one of a metal and a metal-coated plastic. In another example embodiment, LSU housing 500 is formed from a non-metallic material that is encased in or otherwise combined with a conductive mesh 502 (see FIG. 5). LSU housing 500, in this way, serves to shield the components within LSU housing 500 from electromagnetic interference. It is understood that LSU housing 500 may have other shapes or otherwise be formed from differently sized and shaped portions. For instance, first portion 80 may itself be formed from multiple sub-portions permanently or removably connected together. In particular, an upper part of first portion 80, as viewed from FIGS. 4 and 5, may be removable from the remaining part of first portion 80, thereby resulting in LSU housing 500 having two covers or lids. It is also understood that a second cover or lid may be located elsewhere along first portion 80. It is further understood that second portion 90 may itself be formed from multiple sub-portions permanently or removably connected together.

FIGS. 2 and 3 illustrate drive circuitry card 300 disposed within LSU housing 500 and cable 100, which communicates with and provides video signals to drive circuitry card 300 for controlling laser diodes 311-314. A first end of cable 100 is communicatively coupled to drive circuitry card 300 and disposed in the interior of first portion 80 of LSU housing 500. Cable 100 also includes a second end extending from LSU 70 through a space 4 defined between a first portion 80 second portion 90 of LSU housing 500 (see FIG. 5). Cable 100 may be an unshielded cable, such as a ribbon cable. In an example embodiment, an entire portion of cable 100 is unassociated with an electromagnetic filter or other components, such as a toroid, for diminishing the effects of electromagnetic radiation.

The foregoing description of several methods and an embodiment of the invention have been presented for purposes of illustration. It is not intended to be exhaustive or to limit the invention to the precise steps and/or forms disclosed, and obviously many modifications and variations are possible in light of the above teaching. It is intended that the scope of the invention be defined by the claims appended hereto.

What is claimed is:

1. A scan unit for an imaging device, comprising:
  a movable mirror;
  one or more light sources, a light beam generated by each light source being directed towards the movable mirror such that movement of the movable mirror causes each light beam that is reflected by the movable mirror to follow a distinct scan pattern;
  an optical assembly associated with each reflected light beam so as to form an optical path for each reflected light beam from the movable mirror;
  a housing in which the movable mirror, the one or more light sources and the optical assembly are secured, at least a portion of the housing made from electrically conductive material for shielding an interior of the housing from electromagnetic fields external to the housing; and
  a drive circuitry card disposed in the interior of the housing and communicatively coupled to the one or more light sources for driving the one or more light sources, wherein the housing comprises a conductive mesh.

2. The scan unit of claim 1, wherein the housing comprises a metal housing.

3. The scan unit of claim 1, wherein the housing is constructed from a metal-coated non-metal.

4. The scan unit of claim 1, wherein the drive circuitry card is mounted in the interior of the housing.

5. The scan unit of claim 1, wherein the housing comprises a dish member in which the movable mirror, the one or more light sources, the optical assembly and the drive circuitry card are wholly disposed and secured, and a lid member attached to the dish member for defining the interior of the housing, the scan unit further comprising a cable having a first end communicatively coupled to the drive circuitry card and disposed in the interior of the housing and a second end extending from the housing through a space defined between the lid member and the dish member so as to be external to the housing for receiving one or more video signals for controlling the one or more light sources.

6. The scan unit of claim 5, wherein the cable is an unshielded cable.

7. The scan unit of claim 6, wherein an entire portion of the cable between the first and second ends thereof is unassociated with one of a toroid and an electromagnetic filter.

8. The scan unit of claim 1, further comprising a mirror motor disposed in the housing, wherein the mirror motor is coupled to the movable mirror and the drive circuitry card, the mirror motor rotating the movable mirror about an axis based on signals received from the drive circuitry card.

9. The imaging device of claim 1, wherein the drive circuitry card is mounted and wholly disposed in the interior of the housing.

10. The scan unit of claim 1, wherein the housing is constructed from a non-metallic material being one of encased in and combined with the conductive mesh.

11. An imaging device, comprising:
  a scan unit, comprising:
    a mirror rotatable about an axis;
    one or more light sources, a light beam generated by each light source being directed towards the mirror such that movement of the mirror causes each light beam that is reflected by the mirror to follow a distinct scan pattern;
    an optical assembly associated with each reflected light beam including optical components forming an optical path for each reflected light beam from the mirror;
    a housing to which the mirror, the one or more light sources, and the optical assembly are secured, at least a portion of the housing made from electrically conductive material for shielding an interior of the housing from electromagnetic interference; and a drive circuitry card disposed in the interior of the housing and communicatively coupled to the one or more light sources of the scan unit for driving the one or more light sources, wherein the housing comprises a dish member in which the mirror, the one or more light sources, the optical assembly and the drive circuitry card are wholly disposed and secured, and a lid member attached to the dish member for defining the interior of the housing, the scan unit further comprising a cable having a first end communicatively coupled to the drive circuitry card and disposed in the interior of the housing and a second end extending from the housing through a space defined between the lid member and the dish member so as to be external from the housing for receiving one or more video signals for controlling the one or more light sources, the lid member including one or more windows for passing the reflected light beams therethrough.

12. The imaging device of claim 11, wherein the scan unit further comprises a mirror motor disposed in the housing and coupled to the mirror, the mirror motor rotating the mirror based on the one or more video signals received from the drive circuitry card.

13. The imaging device of claim 11, wherein the housing is constructed from a metal mesh.

14. The imaging device of claim 13, wherein the housing is constructed from a non-metallic material being one of encased in and combined with the metal mesh.

15. The imaging device of claim 11, wherein the drive circuitry card is mounted in the interior of the housing along a side portion of the dish member thereof.

16. The imaging device of claim 11, wherein the cable is an unshielded cable.

17. The imaging device of claim 16, wherein an entire portion of the cable between the first and second ends thereof is unassociated with one of a toroid and an electromagnetic filter.

18. The imaging device of claim 11, wherein at least one of the dish member and the lid member is formed from a plurality of members connected together.

19. The imaging device of claim 11, wherein the housing is constructed from a metal-coated non-metal.

20. A scan unit for an imaging device, comprising:
a movable mirror;
one or more light sources, a light beam generated by each light source being directed towards the movable mirror such that movement of the movable mirror causes each light beam that is reflected by the movable mirror to follow a distinct scan pattern;
an optical assembly associated with each reflected light beam so as to form an optical path for each reflected light beam from the movable mirror;
a housing in which the movable mirror, the one or more light sources and the optical assembly are secured, the housing including a metal mesh shielding an interior of the housing from electromagnetic fields external to the housing; and
a drive circuitry card wholly disposed in the interior of the housing, the one or more light sources being disposed on the drive circuitry card, the drive circuitry card including one or more light source driver components mounted thereto and coupled to the one or more light sources for driving the one or more light sources.

* * * * *